(12) United States Patent
Soga et al.

(10) Patent No.: US 6,402,495 B2
(45) Date of Patent: Jun. 11, 2002

(54) RESIN-MOLDING DIE

(75) Inventors: Hisashi Soga; Kouichi Sinzawa; Yoshihisa Fuse, all of Tokyo (JP)

(73) Assignee: Kabushiki Kaisha T AN T, Tokyo (JP)

( * ) Notice: Subject to any disclaimer, the term of this patent is extended or adjusted under 35 U.S.C. 154(b) by 0 days.

(21) Appl. No.: 09/739,375

(22) Filed: Dec. 19, 2000

(30) Foreign Application Priority Data

Dec. 28, 1999 (JP) .............................................. 11-373024

(51) Int. Cl.⁷ ................................................ B29C 45/14
(52) U.S. Cl. .................... 425/116; 425/127; 425/129.1; 425/297; 425/301; 425/556
(58) Field of Search ................................ 425/116, 127, 425/129.1, 556, 291, 292, 295, 297, 301

(56) References Cited

U.S. PATENT DOCUMENTS

| | | | | |
|---|---|---|---|---|
| 5,182,032 A | * | 1/1993 | Dickie et al. ................. | 249/91 |
| 5,358,396 A | * | 10/1994 | Giesen ......................... | 249/102 |
| 5,512,223 A | * | 4/1996 | Morikta ....................... | 264/161 |
| 5,545,366 A | * | 8/1996 | Lust et al. .................... | 264/2.5 |
| 6,106,259 A | * | 8/2000 | Lee et al. .............. | 264/272.17 |

* cited by examiner

Primary Examiner—Tim Heitbrink
(74) Attorney, Agent, or Firm—Nixon & Vanderhye P.C.

(57) ABSTRACT

A resin-molding die for embedding in a molded resin a plurality of bus bars connected with each other via a bridge portion includes a supporting member formed on a first mold, for supporting the bus bars, a pin-receiving hole formed in the supporting member at a position associated with the bridge portion, and a pin provided on a second mold at the position associated with the bridge portion and the pin-receiving hole, for cutting and raising the bridge portion substantially at an intermediate part thereof.

4 Claims, 5 Drawing Sheets

RESIN-MOLDING DIE

BACKGROUND OF THE INVENTION

1. Field of the Invention

The present invention relates to resin molding dies, in particular, to a resin molding die for embedding in a molded resin a bus bar unit for connecting an automotive lamp unit, such as a compartment lamp unit and a map lamp unit, to a power supply (battery) via switches.

2. Description of the Related Art

Hitherto, in an automotive lamp unit provided with compartment lamps, map lamps, and the like, a bus bar unit is mounted in grooves formed in a resin base member formed by an injection mold, and the lamps have been connected by the bus bar unit to a power source via switches.

The automotive lamp unit provided with a plurality of lamps, such as compartment lamps and map lamps, mounted in one base member must have a plurality of bus bars, the operation of mounting the bus bars on the base member being laborious. Moreover, a problem has been found in that the bus bars are likely to remove from the base member by vibration or the like because the bus bars are mounted on the base member only by being coupled therewith.

In order to overcome these problems, a technology disclosed in, for example, Japanese Unexamined Patent Application Publication No. 7-323784 may be used, in which a plurality of bus bars are integrated into one bus bar unit via bridge portions, and the bus bar unit is set in an injection mold and is embedded in a molded resin by injection.

The embedded bus bars are electrically separated from each other by being cut and separated from each other at the bridge portions by using a press machine or the like in the subsequent process. However, manufacturing costs significantly increase in this method because a blanking die is required and two processes are necessary, that is, an injection molding process and a process of cutting the bridge portions. Moreover, metallic particles of the bridge portions are produced, which is waste in materials, and the metallic particles must be disposed of.

A method for overcoming these problems is known which uses a molding die disclosed in, for example, Japanese Unexamined Utility Model Application Publication No. 63-61129, in which a step of molding and a step of cutting bridge portions are simultaneously performed in a molding process. The configuration of the molding die is described below with reference to FIGS. 7A and 7B.

In FIGS. 7A and 7B, an injection mold 1 is provided with cutting blades 1a protruding therefrom for cutting a lead frame 3, and another injection mold 2 is provided with blade-receiving recesses 2a formed therein for receiving the cutting blades 1a. The molds 1 and 2 are provided with respective cavities 1b and 2b formed therein, in which a semiconductor chip 4 and a bonding wire 5 are embedded.

A method for molding by using molding dies having the above-described configuration is described below. The lead frame 3 is placed between the molds 1 and 2 so that the semiconductor chip 4 and the bonding wire 5 are positioned in the cavities 1b and 2b.

When one of the molds 1 and 2, for example, the mold 1 comes close to the other mold, for example, the mold 2, the cutting blades 1a of the mold 1 cut away an unnecessary portion of the lead frame 3 and come into the blade-receiving recesses 2a, and the molds 1 and 2 cover the semiconductor chip 4 and the bonding wire 5 at the cavities 1b and 2b.

After a melted resin is injected into the cavities 1b and 2b and is cured, a molded resin is discharged from the molds 1 and 2, whereby a product including the lead frame 3, from which the unnecessary portion is cut away, can be obtained.

In the above-described molds, particles 3a cut away by the cutting blades 1a remain in the blade-receiving recesses 2a. Therefore, a problem is found in that when the molding operation is repeatedly performed, the particles 3a are piled in the blade-receiving recesses 2a, of which removing operation is laborious.

In the known molds, the particles 3a are cut away by the cutting blades 1a by temporarily fixing the lead frame 3 to the mold 2. Therefore, when a load is applied to the lead frame 3, by the cutting blades 1a, the lead frame 3 removes from the mold 2, thereby producing a defective product in which the entire semiconductor chip 4 and the bonding wire 5 are not embedded in a molded resin.

SUMMARY OF THE INVENTION

Accordingly, it is an object of the present invention to provide a resin molding die for embedding in a molded resin a bus bar unit including a plurality of bus bars connected with each other via a bridge portion, in a manner such that the plurality of bus bars set in an injection mold are separated from each other at the bridge portion without cutting away the same, and a resin is injected into the injection mold. By using the resin mold, manufacturing processes can be reduced because a product can be manufactured in one process, and metallic particles are not produced because the bus bars are separated at the bridge portion without cutting away the same, whereby the consumption of a material is suppressed, a process of disposing of waste is omitted, and cut-away-particles are not necessary to be removed from the molding die.

It is another object of the present invention to provide a resin molding die for embedding in a molded resin a bus bar unit including a plurality of bus bars connected with each other via a bridge portion, in a manner such that the plurality of bus bars are separated from each other at the bridge portion by a pin fixed to a mold cutting and raising the bridge portion while the mold to which the pin is fixed is restraining the bus bar unit, whereby. the bus bar unit does not remove from the mold, thereby preventing defective products from being produced.

To these ends, according to an aspect of the present invention, a resin-molding die for embedding in a molded resin a plurality of bus bars connected with each other via a bridge portion comprises a supporting member formed on a first mold, for supporting the bus bars; a pin-receiving hole formed in the supporting member at a position associated with the bridge portion; and a pin provided on a second mold at the position associated with the bridge portion and the pin-receiving hole, for cutting and raising the bridge portion substantially at an intermediate part thereof.

The resin-molding die may further comprise a pressing member disposed at the second mold side for pressing the bridge portion at least in the vicinity of the bridge portion toward the supporting member. The pressing member may be formed on a movable member which is movable toward the second mold provided with the pin, the movable member being urged toward the first mold by a resilient member.

The second mold provided with the pin is preferably provided with a resin-conduit for supplying a melted resin into the resin-molding die, and the pin may cut and raise the bridge portion and the resin conduit may communicate with a chamber formed in the resin-molding die when the first mold presses the movable member toward the second mold against a resilient force of the resilient member.

DESCRIPTION OF THE PREFERRED EMBODIMENTS

Figure 1:
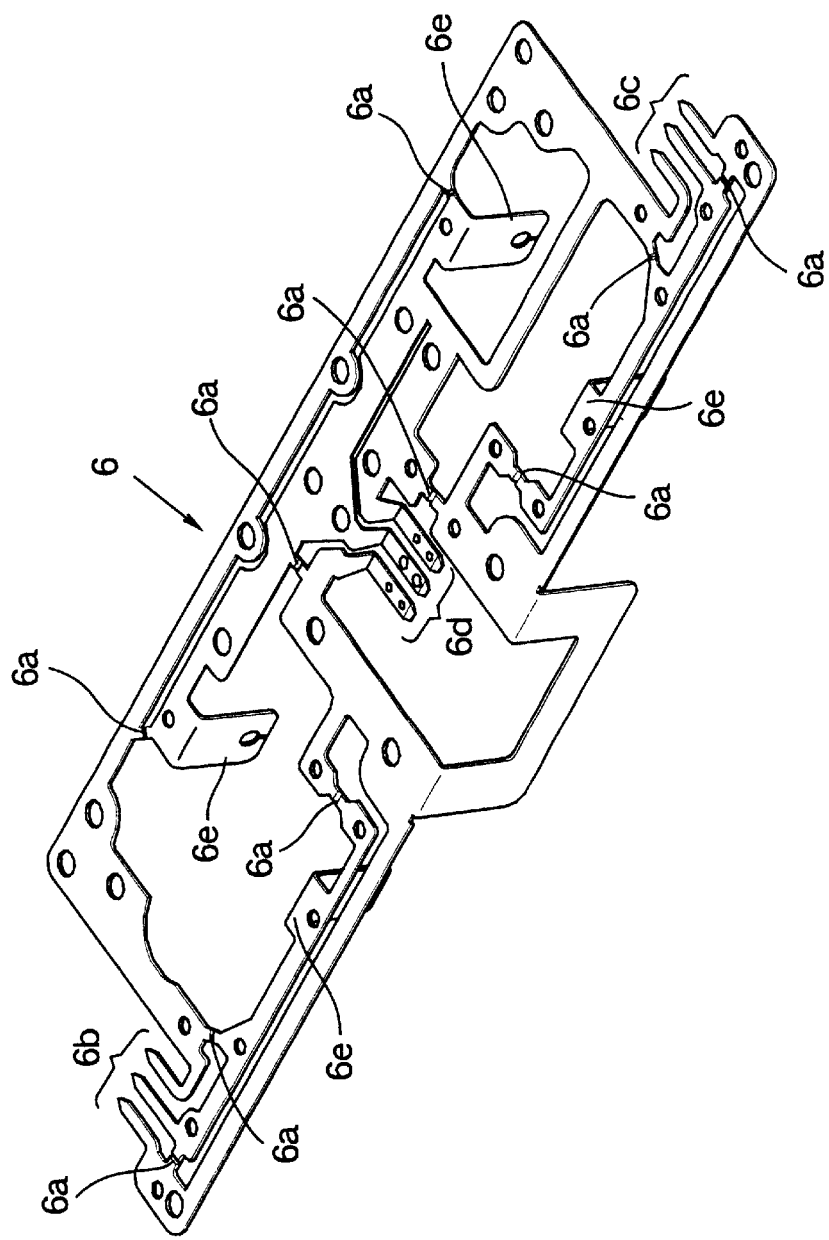
FIG. 1 is a perspective view of a bus bar unit to be embedded in a molded resin by a molding die according to the present invention.

FIG. 1 shows a bus bar unit 6 to be embedded in a molded resin by a resin-molding die according to the present invention. The bus bar unit 6 includes six bus bars connected with each other via ten bridge portions 6a, which are embedded in a molded resin and separated from each other so as to be used in an automotive lamp unit. In FIG. 1, terminals 6b and 6c are connected to switches, terminals 6d are connected to a power source, and raised tabs 6e support lamps.

An embodiment of the resin-molding die according to the present invention is described below with reference to FIGS. 2 to 6. The injection resin-molding die includes a movable mold unit 7 and a fixed mold unit 8. The movable mold unit 7 includes a movable mold 71 and a movable member 72 mounted movable back and forth in the movable mold unit 7. The fixed mold unit 8 includes a fixed mold 81 and a movable member 82 mounted in the fixed mold unit 8 between the fixed mold 81 and the movable mold unit 7 and movable back and forth.

The movable mold unit 7 is provided with a supporting member 71a for supporting the bus bar unit 6 on a face of the movable mold 71 opposing the movable member 82 of the fixed mold unit 8, and a guide hole 71b for receiving a positioning pin 81a protruding from the fixed mold 81. The supporting member 71a is provided with a receiving hole 71c for receiving a pin 81c (described below), formed in the supporting member 71a at a position thereof associated with the bridge portion 6a of the bus bar unit 6.

The movable member 72 is provided with a pair of pressing pins 72a for removing the bus bar unit 6 from the supporting member 71a supporting the bus bar unit 6, the pressing pins 72a being formed so as to protrude in the vicinity of the supporting member 71a at ends of the pressing pins 72a. The movable member 72 is provided with a pressing rod 72b formed so as to protrude from the movable mold 71 toward the movable member 82 of the fixed mold unit 8, the pressing rod 72b serving for depressing the movable member 82 by protruding from the movable mold 71. A driving rod 72c drives the movable member 72 back and forth.

The fixed mold 81 is provided fixed thereto with the positioning pin 81a formed so as to protrude from the movable member 82, for positioning the movable mold unit 7 with respect to the fixed mold unit 8 by mating with the guide hole 71b. The fixed mold 81 is also provided with a resin conduit 81b for introducing a melted resin into a chamber C defined by the movable members 82 and 71, and the pin 81c for pressing the bus bar unit 6 at the groove of the bridge portion 6a of the bus bar unit 6 for raising the bridge portion 6a of the bus bar unit 6.

The movable member 82 is provided with holes through which the positioning pin 81a, the resin conduit 81b, and the pin 81c can pass, and a pressing member 82a for clamping the bus bar unit 6 with the supporting member 71a of the movable mold 71 at least at the bridge portion 6a of the bus bar unit 6. A spring 83 resiliently presses the movable member 82 toward the movable mold 71.

A process, in which the bridge portions 6a of the bus bar unit 6 are raised by using an injection mold when molding, is described below.

Figure 2:
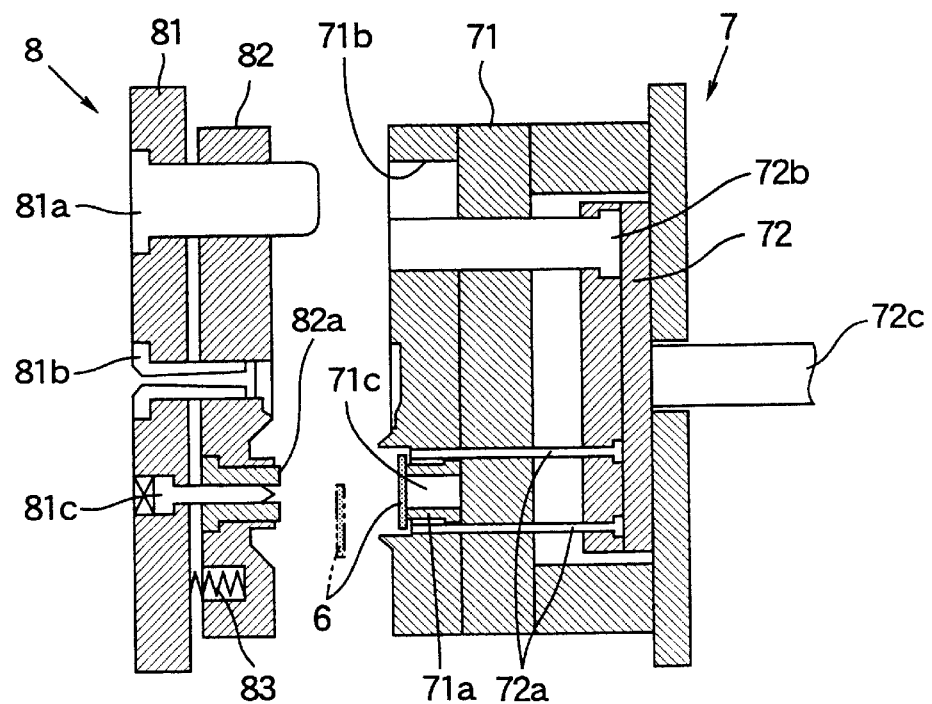
FIG. 2 is a sectional view of a resin molding die according to the present invention, showing a first process of resin-molding.
Figure 3:
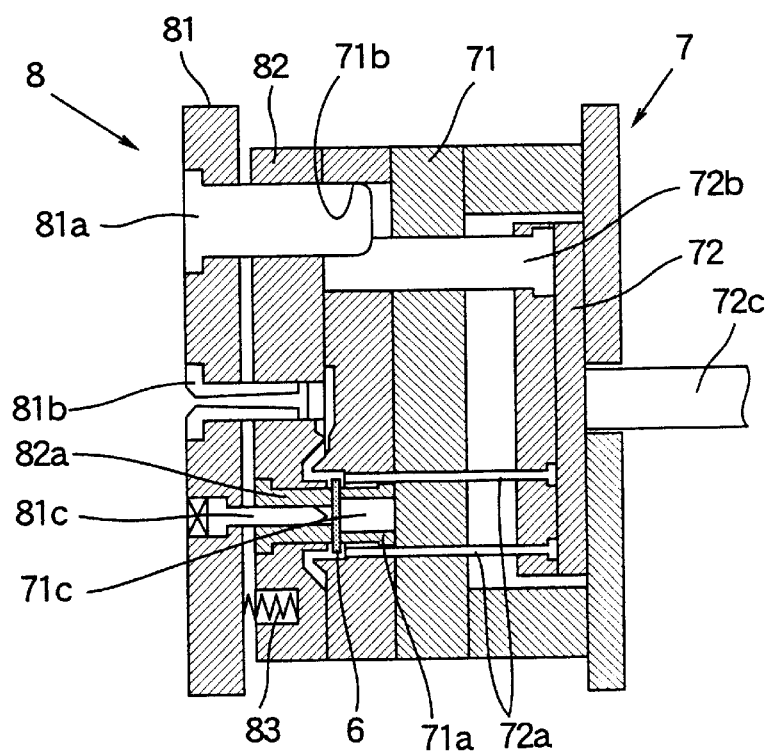
FIG. 3 is a sectional view of the resin molding die according to the present invention, showing a second process of resin-molding.

The bus bar unit 6 is set onto the supporting member 71a of the movable mold 71, as shown in FIG. 2. In FIG. 3, the movable mold 71 is moved toward the fixed mold 81 as the positioning pin 81a mates with the guide hole 71b so as to be positioned with respect to each other. In this case, the movable member 82 is pressed by the movable mold 71 toward the fixed mold 81 while being urged by the spring 83 in the other direction, whereby the pressing member 82a of the movable member 82 presses the bus bar unit 6 toward the supporting member 71a of the movable mold 71, whereby the bus bar unit 6 is clamped by the pressing member 82a of the movable member 82 and the supporting member 71a of the movable mold 71, and the chamber C is formed.

Figure 4:
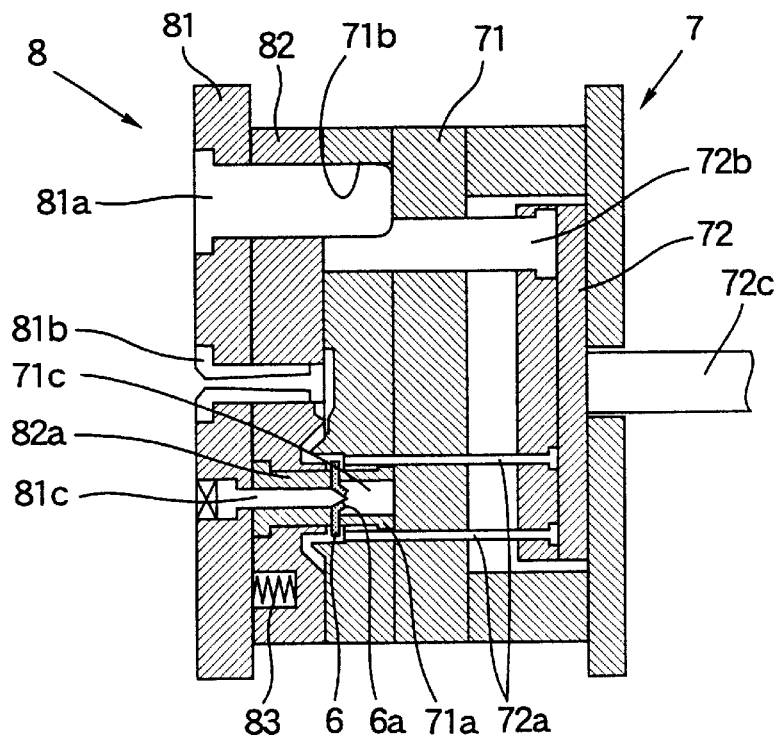
FIG. 4 is a sectional view of the resin molding die according to the present invention, showing a third process of resin-molding.

In FIG. 4, when the movable mold 71 further moves until the movable mold 71 comes into contact with the movable member 82 at the leading face of the movable mold 71, an end of the pin 81c fixed to the fixed mold 81 presses the bridge portion 6a of the bus bar unit 6 at the groove formed in the bridge portion 6a, whereby the bridge portion 6a of the bus bar unit 6 is raised. With this operation, for example, six bus bars, as described above in the known bus bar unit, are formed electrically separated from each other.

Figure 5:
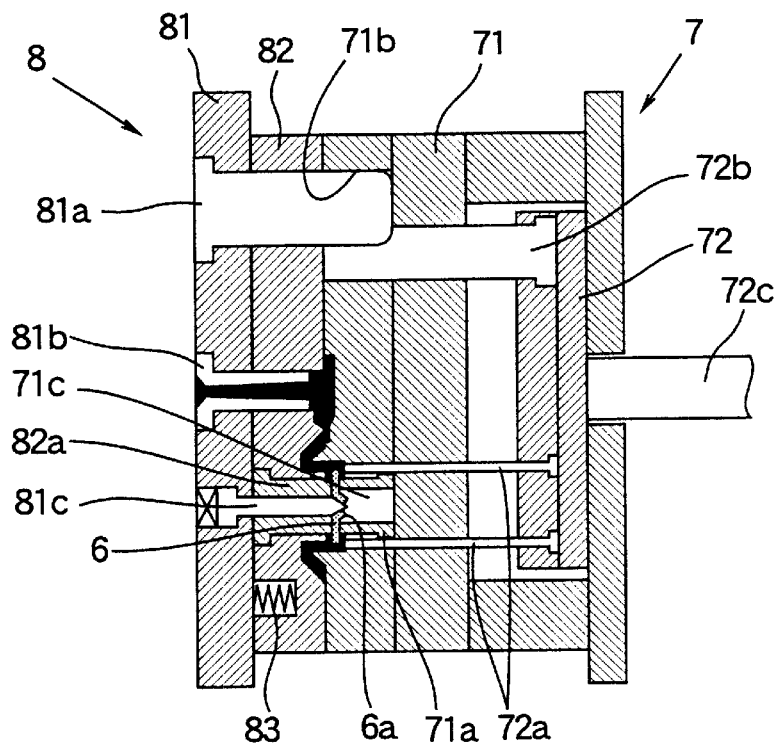
FIG. 5 is a sectional view of the resin molding die according to the present invention, showing a fourth process of resin-molding.

A melted resin is injected in the chamber C through the resin conduit 81b communicating with the chamber C in a step shown in FIG. 4, thereby embedding the bus bar unit 6 in a molded resin, as shown in FIG. 5.

Figure 6:
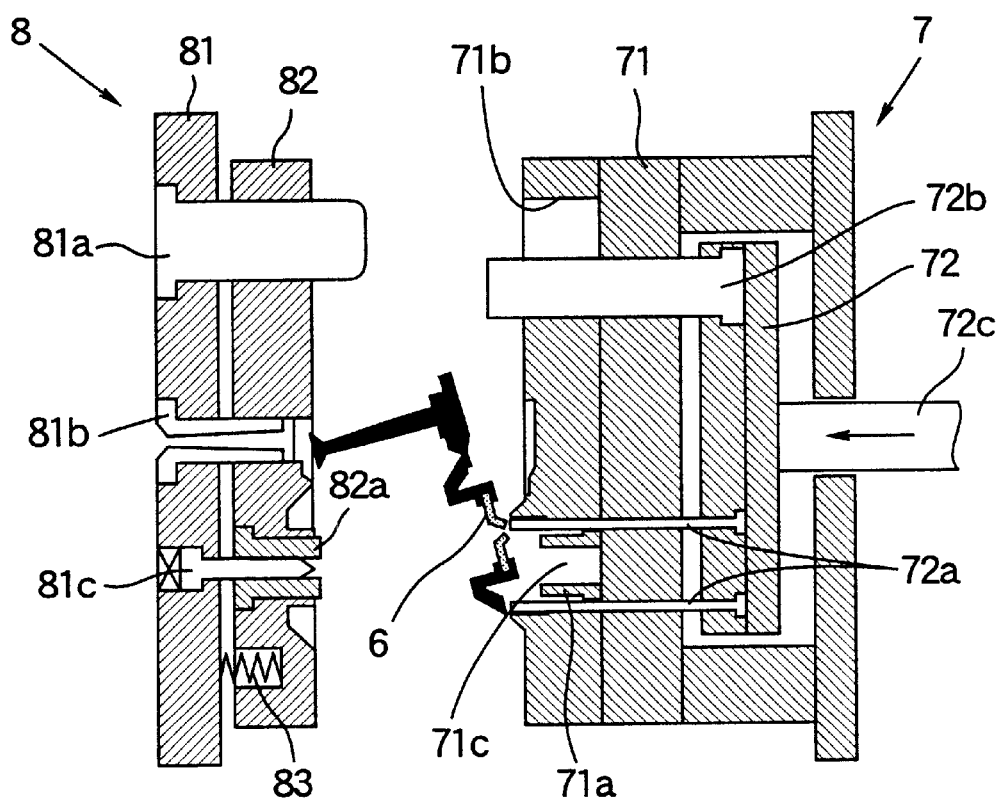
FIG. 6 is a sectional view of the resin molding die according to the present invention, showing a fifth process of resin-molding.
Figure 7:
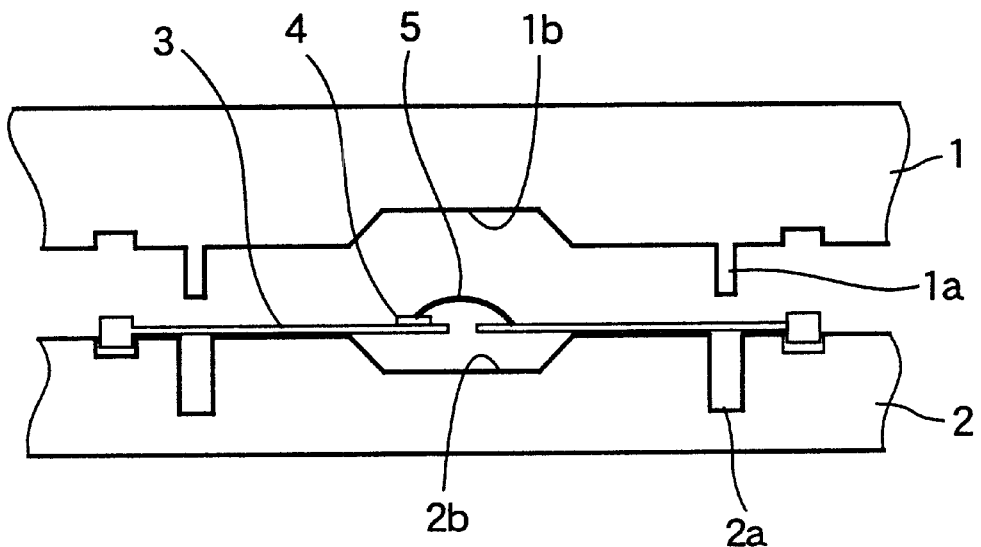
FIG. 7A is a sectional view of a known resin-molding die, showing-a resin-molding process by using the die, in which a lead frame is set.
FIG. 7B is a sectional view of the known resin-molding die, showing a resin-molding process by using the die, in which a resin is charged.
Figure 7:
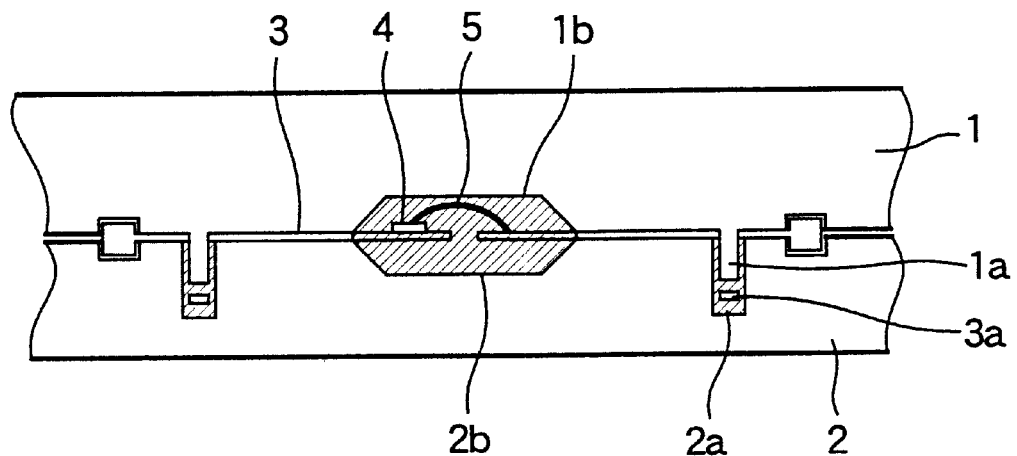

In FIG. 6, when the movable mold 71 is moved away from the fixed mold 81 and the driving rod 72c presses the movable member 72 toward the fixed mold 81 after the resin in the chamber C is cured, the pressing rod 72b presses the movable member 82 so as to remove the resin remaining in the resin conduit 81b, and the pressing pins 72a press the bus bar unit 6 so as to remove the same from the movable member 72, whereby the bus bar unit 6 embedded in the molded resin removes from the injection molds. Unnecessary portions such as parts corresponding to gates and runners are cut away, thereby forming an automotive lamp unit.

Although in the present embodiment, a molding die for embedding a bus bar unit in a molded resin to be used in an automotive lamp unit is used, the molding die may be used for embedding any type of metallic plates serving as leads connected with bridge portions.

The resin-molding die according to the present invention for embedding in a molded resin a plurality of bus bars connected via bridge portions includes a supporting member provided on a mold, for supporting the bus bars, a pin-receiving holes formed in the supporting member at positions associated with the bridge portions, and pins provided on another mold at positions opposing the bridge portions, for cutting and raising the bridge portions substantially at an intermediate part of each bridge portion. With this arrangement, the manufacturing processes can be reduced because a product can be manufactured in one process, waste in material is not produced, and it is not necessary to dispose of metallic particles, because the bus bars are separated from each other at the bridge portions without cutting away the same.

The bus bars are separated from each other at the bridge portions while the bus bars are held by the mold provided with the pins for cutting, whereby the bus bars do not remove from the molds, thereby preventing defective products from being produced.

What is claimed is:

1. A resin-molding die for embedding in a molded resin a plurality of bus bars connected with each other via a bridge portion, comprising:

a supporting member formed on a first mold, for supporting the bus bars;

a pin-receiving hole formed in the supporting member at a position associated with the bridge portion; and a pin provided on a second mold at the position associated with the bridge portion and the pin-receiving hole, for cutting and raising the bridge portion substantially at an intermediate part thereof.

2. A resin-molding die according to claim 1, further comprising a pressing member disposed at the second mold side for pressing the bridge portion at least in the vicinity of the bridge portion toward the supporting member.

3. A resin-molding die according to claim 2, wherein the pressing member is formed on a movable member which is movable toward the second mold provided with the pin, the movable member being urged toward the first mold by a resilient member.

4. A resin-molding die according to claim 1, wherein the second mold provided with the pin is provided with a resin-conduit for supplying a melted resin into the resin-molding die, and the pin cuts and raises the bridge portion and the resin conduit communicates with a chamber formed in the resin-molding die when the first mold presses the movable member toward the second mold against a resilient force of the resilient member.

* * * * *